(12) United States Patent
Jiang et al.

(10) Patent No.: US 12,165,831 B2
(45) Date of Patent: Dec. 10, 2024

(54) METHOD AND SYSTEM OF IMAGE-FORMING MULTI-ELECTRON BEAMS

(71) Applicant: KLA CORPORATION, Milpitas, CA (US)

(72) Inventors: Xinrong Jiang, Palo Alto, CA (US); Christopher Sears, Fremont, CA (US); Youfei Jiang, Milpitas, CA (US); Sameet K. Shriyan, Milpitas, CA (US); Jeong Ho Lee, Palo Alto, CA (US); Michael Steigerwald, Milpitas, CA (US); Ralph Nyffenegger, Palo Alto, CA (US)

(73) Assignee: KLA CORPORATION, Milpitas, CA (US)

( * ) Notice: Subject to any disclaimer, the term of this patent is extended or adjusted under 35 U.S.C. 154(b) by 368 days.

(21) Appl. No.: 17/829,230

(22) Filed: May 31, 2022

(65) Prior Publication Data

US 2024/0096586 A1 Mar. 21, 2024

(51) Int. Cl.
| | | |
|---|---|---|
| H01J 37/153 | (2006.01) | |
| H01J 37/06 | (2006.01) | |
| H01J 37/12 | (2006.01) | |
| H01J 37/244 | (2006.01) | |
| H01J 37/28 | (2006.01) | |

(52) U.S. Cl.
CPC ............ *H01J 37/153* (2013.01); *H01J 37/06* (2013.01); *H01J 37/12* (2013.01); *H01J 37/244* (2013.01); *H01J 37/28* (2013.01); H01J 2237/0451 (2013.01); H01J 2237/04735 (2013.01); H01J 2237/103 (2013.01); H01J 2237/151 (2013.01); H01J 2237/152 (2013.01); H01J 2237/1532 (2013.01); H01J 2237/1536 (2013.01); H01J 2237/2448 (2013.01)

(58) Field of Classification Search
CPC .......... H01J 37/153; H01J 37/06; H01J 37/12; H01J 37/244; H01J 37/28; H01J 2237/0451; H01J 2237/103; H01J 2237/04735; H01J 2237/151; H01J 2237/152; H01J 2237/1532; H01J 2237/1536; H01J 2237/2448
See application file for complete search history.

(56) References Cited

U.S. PATENT DOCUMENTS

| 8,362,425 B2 | 1/2013 | Han et al. |
|---|---|---|
| 10,090,131 B2 | 10/2018 | Jiang et al. |

(Continued)

FOREIGN PATENT DOCUMENTS

WO 2020193102 A1 10/2020

OTHER PUBLICATIONS

WIPO, International Search Report for International Application No. PCT/US2023/022470, Sep. 5, 2023.

*Primary Examiner* — David E Smith
(74) *Attorney, Agent, or Firm* — Hodgson Russ LLP

(57) ABSTRACT

A multi-electron beam system that forms hundreds of beamlets can focus the beamlets, reduce Coulomb interaction effects, and improve resolutions of the beamlets. A Wien filter with electrostatic and magnetic deflection fields can separate the secondary electron beams from the primary electron beams and can correct the astigmatism and source energy dispersion blurs for all the beamlets simultaneously.

22 Claims, 13 Drawing Sheets

(56) References Cited

U.S. PATENT DOCUMENTS

| | | | |
|---|---|---|---|
| 10,096,447 B1 | 10/2018 | Jiang et al. | |
| 10,748,739 B2 | 8/2020 | Jiang et al. | |
| 11,056,312 B1 | 7/2021 | Jiang et al. | |
| 2008/0135755 A1* | 6/2008 | Suzuki | H01J 37/28 250/310 |
| 2010/0320382 A1 | 12/2010 | Almogy et al. | |
| 2012/0241606 A1* | 9/2012 | Han | H01J 37/04 250/307 |
| 2016/0172150 A1* | 6/2016 | Li | H01J 37/145 250/396 ML |
| 2016/0217968 A1 | 7/2016 | Li et al. | |
| 2020/0051779 A1 | 2/2020 | Ren et al. | |
| 2022/0367140 A1 | 11/2022 | Jiang | |
| 2023/0066086 A1 | 3/2023 | Jiang | |
| 2023/0109032 A1 | 4/2023 | Jiang et al. | |

* cited by examiner

METHOD AND SYSTEM OF IMAGE-FORMING MULTI-ELECTRON BEAMS

FIELD OF THE DISCLOSURE

This disclosure relates to electron beam systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

A focused electron beam system is commonly used to create or examine the microstructure of articles, such as a silicon wafer used in the fabrication of integrated circuits. The electron beam is formed with electrons that are emitted from an emitter in an electron gun, which acts as a fine probe when it interacts with the wafer for examining microstructures. A single electron beam was previously used for wafer inspection and review to examine finished or unfinished IC components in nanometer critical dimension (CD) levels. The throughput of a single electron beam apparatus is fairly low. Semiconductor manufacturers are seeking higher throughput systems.

The throughput of a multi-electron beam apparatus is characterized by the number of sub-beams, or the number of total electron beamlets. The larger the beamlet number, the higher the throughput will be. However, increasing the number of beamlets is prevented by an image-forming projection optics, which consists of global-optical elements including a global objective lens and Wien filter. With increasing demands for more electron beamlets to reach higher throughputs, it is difficult to provide image-forming uniformity across a large field of view (FOV) with the image-forming projection system because of the off-axis aberrations from outer beamlets, the source energy dispersion blurs, optical astigmatisms due to the presence of a Wien filter, and strong Coulomb interaction influences due to higher beam currents with more beamlets.

Previous electron beam systems suffered from low resolutions due to the influence of Coulomb interactions. The resolutions of a multi-electron beam system were heavily limited by the image-forming projection optics from the intermediate image plane (IIP) to the wafer, which is a beam crossover close to the wafer. The beamlet image-forming resolutions were largely gated by the Coulomb interaction effects around the crossover.

Previous electron beam systems also suffered from problems with source energy dispersion blurs and astigmatism blurs due to the presence of a Wien filter. To remove cross-talk between beamlet signals in a multi-electron beam apparatus, a Wien filter separates the secondary electron beams (SEB) from primary electron beams (PEB) with a large SEB deflection angle by high Wien filter strengths. This causes heavy source energy dispersion blurs and astigmatism blurs of each beamlet across a large FOV.

Improved systems and methods are needed.

BRIEF SUMMARY OF THE DISCLOSURE

A system is provided in a first embodiment. The system includes an electron beam source that generates an electron beam. The electron beam source includes a tip, a suppression electrode, and an extraction electrode. The system further includes a stage configured to hold a wafer in a path of the electron beam; an objective lens in the path of the electron beam; a Wien filter in the path of the electron beam between the objective lens and the electron beam source; a transfer lens in the path of the electron beam between the Wien filter and the electron beam source; and a detection array configured to receive at least one secondary electron beam from the wafer on the stage. The transfer lens includes a pole piece and a transfer lens coil. The objective lens includes an upper pole piece; a lower pole piece; an objective lens coil disposed on the upper pole piece; a charge control plate disposed on the lower pole piece; an acceleration electrode disposed in the path of the electron beam between the upper pole piece and the lower pole piece; and a scanner disposed on the upper pole piece.

The Wien filter can include an electrostatic deflector and a magnetic deflector.

The system can further include a collimation lens in the path of the electron beam and a beam limiting aperture in the path of the electron beam between the collimation lens and the electron beam source.

The system can further include an aperture array disposed in the path of the electron beam; a micro stigmator array disposed in the path of the electron beam between the aperture array and the transfer lens; a micro deflector array disposed in the path of the electron beam between the micro stigmator array and the transfer lens; and a micro lens array disposed in the path of the electron beam between the micro deflector array and the transfer lens. The aperture array splits the electron beam into a plurality of beamlets. The plurality of beamlets includes at least 100 of the beamlets. The electron beam can be a telecentric beam upstream of the aperture array.

In an instance, the path of the electron beam is at a first orientation leaving the transfer lens and at a second orientation different from the first orientation leaving the Wien filter such that the first orientation is at a non-parallel angle to the second orientation.

The system can include a second Wien filter in the path of the electron beam between the Wien filter and the transfer lens. The second Wien filter can include a second electrostatic deflector and a second magnetic deflector.

A method is provided in a second embodiment. The method includes directing a plurality of beamlets through a transfer lens downstream of an electron beam source thereby focusing the electron beam. The beamlets are directed through a Wien filter downstream of the transfer lens thereby separating the secondary electron beam or beams from the beamlets. The beamlets are directed through an upper pole piece of an objective lens. The objective lens is downstream of the Wien filter. The beamlets are directed through an acceleration electrode downstream of the upper pole piece. The beamlets are directed through a charge control plate disposed in a lower pole piece of the objective lens. The charge control plate is disposed on an opposite side of the objective lens from the upper pole piece. The beamlets are directed at a wafer. At least one secondary electron beam is received from the wafer at a detection array.

The plurality of beamlets can include at least 100 of the beamlets.

The method can further include generating an electron beam using the electron beam source and converting the electron beam into the plurality of beamlets.

The method can further include directing the electron beam through a collimation lens and a beam limiting aperture disposed in a path of the electron beam between the electron beam source and the transfer lens.

The method can further include scanning the beamlets with a scanner disposed on the upper pole piece.

The Wien filter can include an electrostatic deflector and a magnetic deflector.

The method can further include splitting an electron beam into the beamlets using an aperture array; directing the beamlets through a micro stigmator array disposed in the path of the beamlets between the aperture array and the transfer lens; directing the beamlets through a micro deflector array disposed in the path of the beamlets between the micro stigmator array and the transfer lens; and directing the beamlets through a micro lens array disposed in the path of the beamlets between the micro deflector array and the transfer lens. The aperture array is disposed in a path of the electron beam between the electron beam source and the transfer lens. The plurality of beamlets can include at least 100 of the beamlets. The electron beam can be a telecentric beam upstream of the aperture array.

The method can further include changing a direction of the beamlets using the Wien filter such that the beamlets are directed at an angle leaving the Wien filter relative to their orientation entering the Wien filter.

The method can further include directing the beamlets through a second Wien filter in a path of the beamlets between the Wien filter and the transfer lens.

The acceleration electrode can be configured to change the resolution of the beamlets.

The Wien filter can be configured to adjust dispersion and astigmatism for the beamlets simultaneously.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

A multi-electron beam system that forms hundreds of beamlets is disclosed herein. A transfer lens (TL) field focuses the beamlets to an optimal optical magnification. An energy acceleration booster field reduces Coulomb interaction effects and improves resolutions of the beamlets. An electron energy retarding (decelerating) and substrate-charging field can be used to obtain desired wafer charging, extracting fields, and landing energies. A magnetic objective lens field can image-form the multi-electron beams at a wafer with minimized optical aberrations. A Wien filter with electrostatic and magnetic deflection fields can separate the secondary electron beam (SEB) or beams from the primary electron beam or beams and can correct the source energy dispersion blurs for all the beamlets simultaneously. The Wien filter can include an electrostatic (or magnetic) stigmator field to correct beamlet astigmatism simultaneously. The transfer lens can select an optical magnification and the acceleration electrode can reduce Coulomb interactions. In an embodiment, the source energy dispersion blurs of the beamlets can be corrected due to the presence of a Wien filter. In another embodiment, the astigmatism blurs of the beamlets can be corrected due to the presence of a Wien filter. In yet another embodiment, the source energy dispersions between two Wien filters can be compensated for such that all the energy dispersion blurs of the beamlets are removed and the secondary electron beams are deflected to the side detection array simultaneously.

Figure 1:
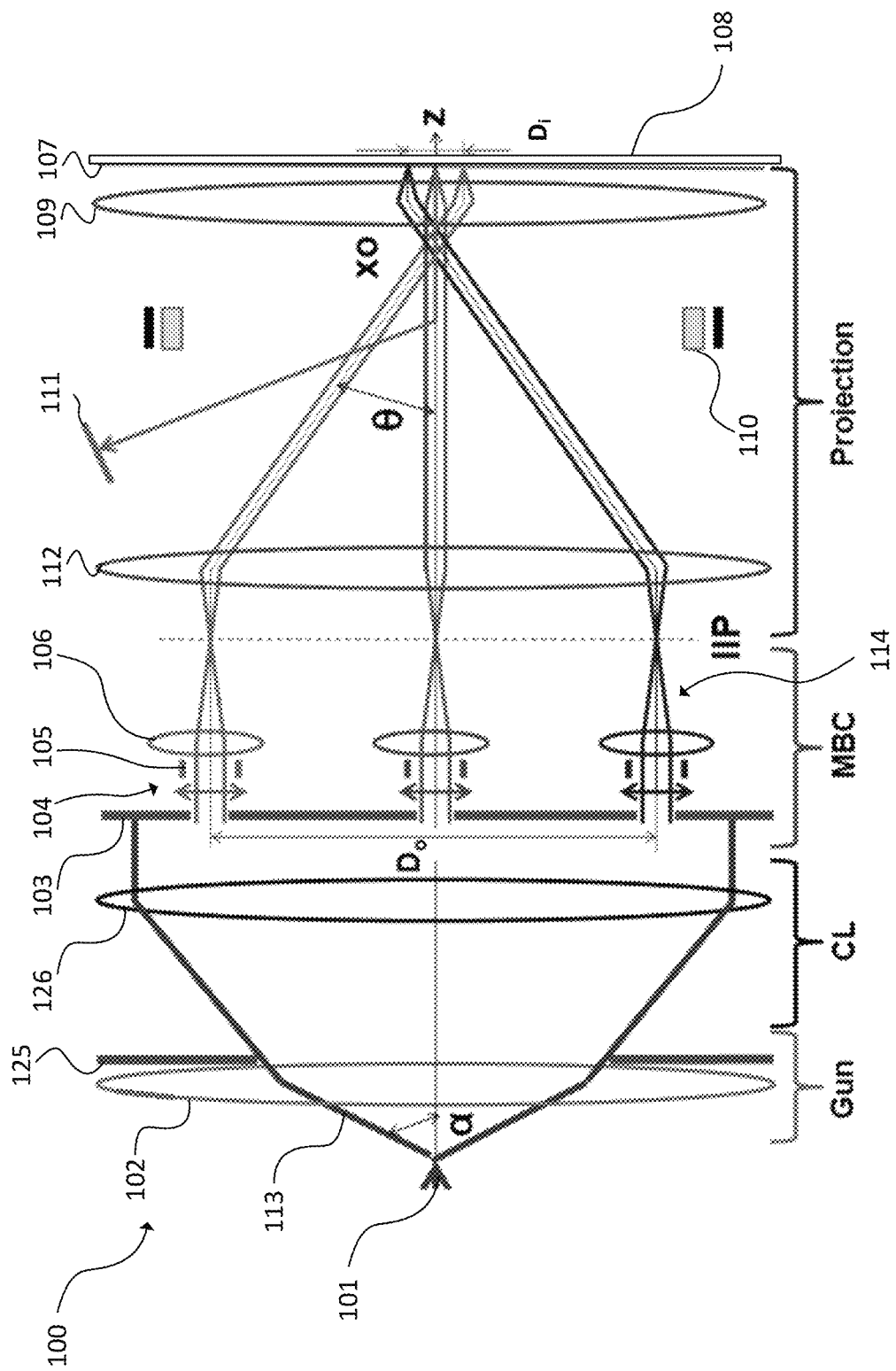
FIG. 1 is an embodiment of a system in accordance with the present disclosure.

FIG. 1 shows the optics of an embodiment of a multi-electron beam apparatus. It includes four optical modules of electron gun ("Gun"), collimation lens ("CL"), multi-electron beam creation ("MBC"), and projection image-formation ("Projection").

As shown in FIG. 1, the system 100 includes an electron beam source that generates an electron beam 113. The electron beam source can include a tip 101. The electron beam source also can include a suppression electrode and extraction electrode. The electron beam source can be a thermal field emission (TFE) or cold field emission (CFE) source that emit electrons from an emitter tip. The electrons are focused by a gun lens (GL) 102 into a large size electron beam 113. The high current electron beam 113 is collimated by the collimation lens 126 into a telecentric beam to illuminate an aperture array 103 (AA). The aperture array 103 also can be referred to as a micro aperture array. An additional electron energy acceleration element, such as an anode, can be used with the electron beam source.

The beam-limiting aperture (BLA) 125 following the gun lens 102 can select the total beam current in illuminating the aperture array 103, which splits the electron beam 113 into beamlets 114. The aperture array 103 is used to select the beam current for each single beamlet 114. There is one hole in the aperture array 103 for each beamlet 114. The holes can be circular, hexagonal, or other shapes. Three beamlets 114 are illustrated in FIG. 1 for simplicity, but other numbers are possible. For example, there may be at least 100 of the beamlets 114 (e.g., greater than 300). Downstream of the aperture array 103, a micro lens array (MLA) 106 focuses each beamlet 114 onto an intermediate image plane (IIP). Each micro lens in the micro lens array 106 may be a magnetic lens or electrostatic lens. A magnetic micro lens may be a number of magnetic pole pieces powered by coil excitations or permanent magnets. An electrostatic micro lens may be an electrostatic Einzel lens, or an electrostatic accelerating/decelerating unipotential lens.

The system 100 includes a collimation lens 126 in the path of the electron beam 113. The collimation lens 126 may be an electrostatic lens or a magnetic lens to focus the divergent electron beam from the gun into a telecentric beam before illuminating the MBC module. The collimation lens 126 can reduce gun spherical aberrations for outer electron beamlets, which can assist with increasing beamlet numbers for higher throughputs. The beam limiting aperture 125 is in the path of the electron beam 113 between the collimation lens 126 and the electron beam source.

A micro stigmator array 104 (MSA) is disposed in the path of the electron beam 113 between the aperture array 103 and the transfer lens 112 and can correct astigmatisms for each beamlet 114. A micro deflector array 105 (MDA) is disposed in the path of the electron beam 113 between the micro stigmator array 104 and the transfer lens 112. The micro deflector array 105 can correct the distortion of each beamlet 114 and/or to scan each beamlet 114 over the wafer 107 with a given sub-FOV. A micro lens array 106 (MLA) is disposed in the path of the electron beam 113 between the micro deflector array 105 and the transfer lens 112. The term "micro" can refer to the size of the components, but also can indicate that these components are used with beamlets 114. The beamlets 114 are smaller than the electron beam 113.

A stage 108 is configured to hold a wafer 107 in a path of the beamlets 114 of the electron beam 113. An objective lens 109 and a Wien filter 110 are upstream of the stage 108.

The electron source emits electrons from the tip 101 and then the electrons are accelerated and focused by a gun lens 102 into a large size of electron beam 113. The electron beam 113 with high beam currents is collimated by the collimation lens 126 into a telecentric beam to illuminate the aperture array 103. The electron beam 113 is characterized by the tip emission angle of α in FIG. 1 given the source brightness or angular intensity. The beam limiting aperture 125 following the gun lens 102 is used to select the total beam current illuminating the aperture array 103. The aperture array 103 is used to select the beam current for each single beamlet 114. Following the aperture array 103, micro stigmator array 104, and micro deflector array 105, the micro lens array 106 focuses each beamlet 114 onto the intermediate image plane. The intermediate image plane is the object plane of the projection image-forming optics in the lower column.

There is a beam crossover (xo) between the transfer lens 112 and objective lens 109. The beamlets 114 formed by the upper column at the intermediate image plane are projected by the transfer lens 112 and objective lens 109 on the wafer (WF) 107 with a desired magnification. The magnification can be configured to minimize all the beam blurs for each beamlet at the wafer. The optimal magnification is given as $D_i/D_o$, in which the $D_i$ and $D_o$ are the multi-electron beam (MB) FOV in the wafer plane (image plane) and intermediate image plane (object plane), respectively. The transfer lens 112 can select a desired position (or the crossover angle θ) of the beam crossover (xo), at which total spot size with each beamlet 114 is minimal while balancing the axial aberrations, off-axis aberrations, and Coulomb interactions between electrons.

For inspecting and reviewing a wafer, the secondary electrons (SE) and/or back-scattered electrons (BSE) emitted from the wafer 107 due to the bombardments of each primary beamlet 114 electrons may be split from the optical axis and deflected toward the detection array 111 by Wien filter 110.

Figure 2:
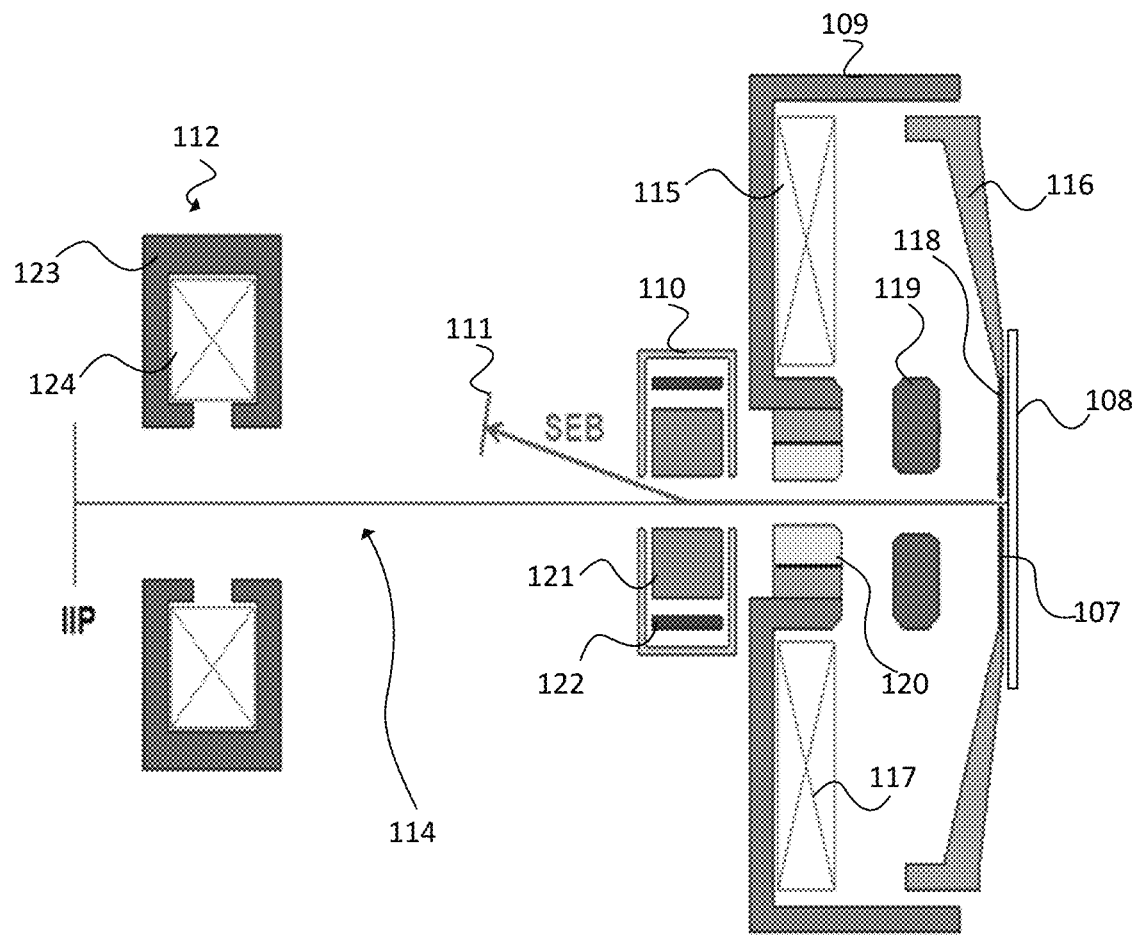
FIG. 2 is an embodiment of an image-forming optics in accordance with the present disclosure.

As shown in FIG. 2, the objective lens 109 is in the path of the beamlets 114 of the electron beam 113. The objective lens 109 includes an upper pole piece 115 and a lower pole piece 116. An objective lens coil 117 is disposed on the upper pole piece 115. A charge control plate 118 is disposed on the lower pole piece 116. An acceleration electrode 119 is disposed in the path of the electron beam 113 between the upper pole piece 115 and the lower pole piece 116. A scanner 120 is disposed on the upper pole piece 115. The scanner 120 can scan all the beamlets 114 in the same way (e.g., raster scan) and the same scanning FOV simultaneously. The scan FOV size is given with the beamlet pitch on the wafer 107.

The Wien filter 110 is in the path of the beamlets 114 of the electron beam 113 between the objective lens 109 and the electron beam source. In an embodiment, the Wien filter 110 includes an electrostatic deflector 121 and a magnetic deflector 122.

The Wien filter 110 can be removed or not activated during operation. This may be beneficial for multi-electron beam lithography or for multi-electron beam review and inspection with an annular detection array (e.g., with the same central detector axis as the primary beam optical axis). Lithography is a direct writing on the wafer photoresist without a need to collect secondary electrons or without a need to separate primary electrons (PE) from secondary electrons. If an annular detection array is used, each SE beamlet hits a fixed sub-detector directly without a need to change direction (deflection). Consequently, a Wien filter may not be required for these applications. For a simpler application, for instance, the beam energy and landing energy are all fixed for one special use and the SE trajectories are fixed. If the use conditions are changed, the SE trajectories are changed as well. In this case, the fixed annular detection array may not be sufficient to meet all applications.

A transfer lens 112 (TL) is in the path of the beamlets 114 of the electron beam 113 between the Wien filter 110 and the electron beam source. The transfer lens 112 includes a pole piece 123 and a transfer lens coil 124. The transfer lens 112 may be a magnetic lens for improved off-axis optical performance with shaped beams or multi-electron beams.

The objective lens 109 can include an electrostatic section and a magnetic section. The electrostatic section of the objective lens 109 can include the ground electrodes, the acceleration electrode 119 with voltage Va, the charge-control plate 118, and stage 108. One or more of these components can be used to electrically charge the wafer 107 and retard (decelerate) the electrons from the beam energy to landing energy on the wafer 107. For example, if an electron beam is 30 keV in the column, the wafer 107 can be biased at −29 kV for an electron beam landing energy of 1 keV. 1 keV can be used for electron beam inspections and reviews, though other values are possible. For charging the wafer 107 with an extraction field on the wafer surface, the charge-control plate 118 should be biased according to application requirements. The magnetic section of the objective lens 109 can include the upper pole piece 115, lower pole piece 116, and the coils. The upper pole piece 115 and lower pole piece 116 can be made of magnetic materials. The upper pole piece 115 may be connected to the ground electrodes like the Wien filter shield or the scanner shield. The lower pole piece 116 may be connected to the charge-control plate 118 electrode. The outer gap between the lower pole piece 116 and upper pole piece 115 may be sealed with insulator materials.

A detection array 111 (DA) is configured to receive secondary electron beams from the wafer 107 on the stage 108. Measurements or images can be generated using signals from the detection array 111. The detection array 111 can be in electronic communication with a processor for image generation, inspection, metrology, or other functions.

The multi-electron beam crossover (xo) in FIG. 1 is arranged around the acceleration electrode 119 to reduce the Coulomb interactions (CI) because the CI-induced optical blurs can dominate over the resolution of each beamlet 114 at the wafer 107. Coulomb interactions may be largely generated at the crossover. Arranging the crossover around the acceleration electrode 119 can accelerate electrons, which can reduce Coulomb effects.

The scanner 120 in FIG. 2 can scan all the electron beamlets 114 over an FOV simultaneously. Each beamlet also may be scanned separately with the micro deflector array 105 in FIG. 1, in which each micro deflector may be controlled independently.

Figure 3:
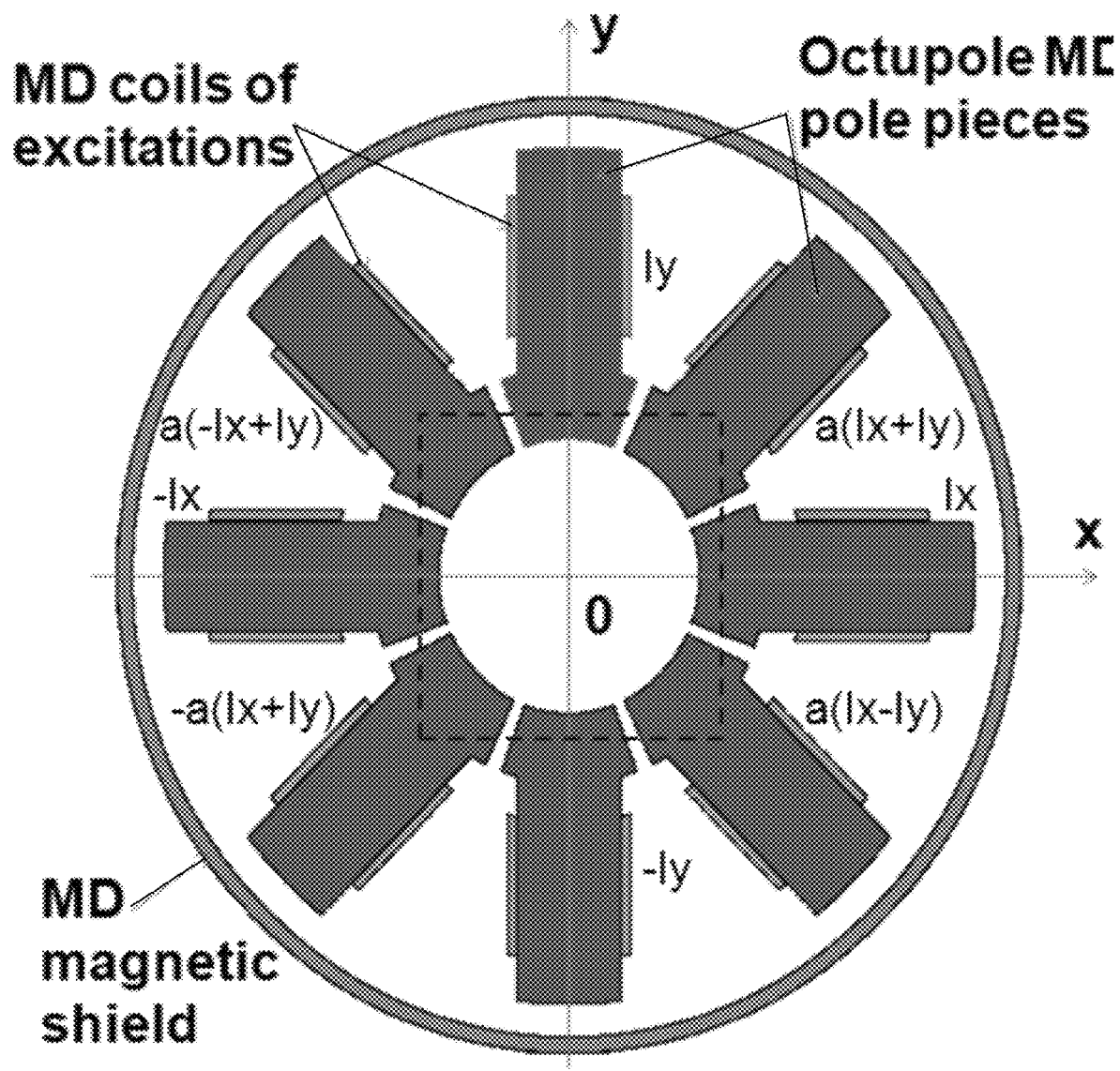
FIG. 3 is an embodiment of a Wien filter with an octupole electrostatic deflector and octupole magnetic deflector.

The Wien filter 110 can include an electrostatic deflector and a magnetic deflector with orthogonal electrostatic field (E-field) and magnetic field (B-field). This is shown by the electrostatic dipole 121 and the magnetic dipole 122. FIG. 3 shows the construction of a Wien filter that includes an octupole electrostatic deflector and an octupole magnetic deflector. Using the magnetic deflection field as an example, FIG. 3 shows the cross-section view of the octupole magnetic deflector (MD). Eight magnetic pole pieces are arranged in a rotationally-symmetric manner as an octupole deflector, and the same numbers of the coil turns are wound around each pole piece. The pole pieces are shielded as shown in FIG. 3. With suitable settings of the currents through the coils, the distributions of the magnetic deflection fields in a large central area may be fairly homogeneous to minimize the coma blurs for the outer beams in hundreds of beamlets. For example, the coil currents may be applied as Iy=1 unit, Ix=0 units, and scaling factor a=1/√2 for a homogenous B-field in y-axis direction. In another example, the coil current may be applied as Ix=1 unit, Iy=0 units, and a=1/√2 for a homogenous B-field in x-axis direction.

Figure 4:
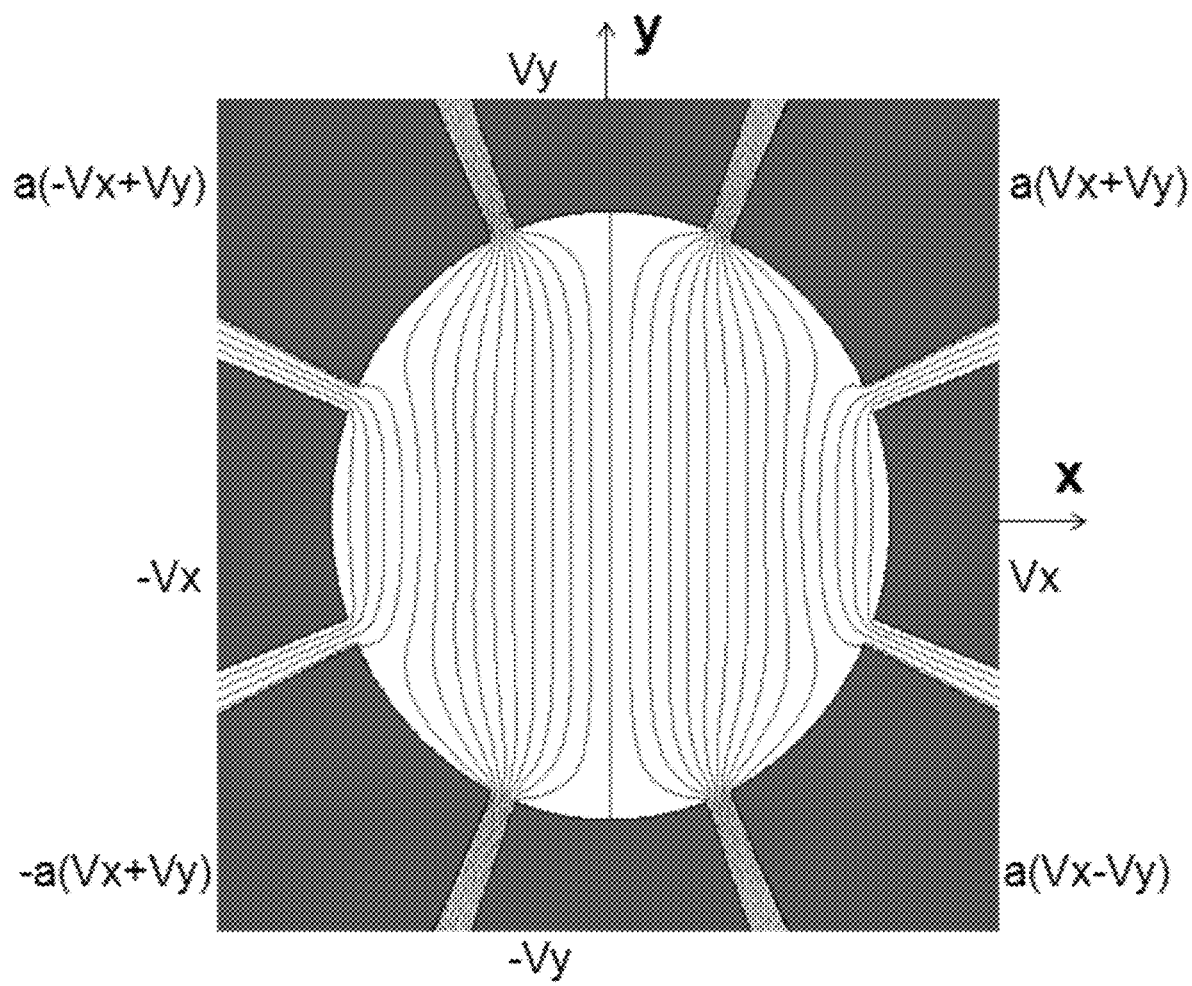
FIG. 4 illustrates an electrostatic deflection field in an octupole electrostatic deflector.

An octupole electrostatic deflector (ED) is shown in FIG. 4, which is taken from the dash-line area of FIG. 3. If setting the deflection voltage Vx=1 unit, Vy=0 units and scaling factor a=1/√2, the electrostatic deflection field in x-axis direction is generated with fairly homogenous field distributions in a large central area, as can be seen in the straight equipotential lines.

Figure 5:
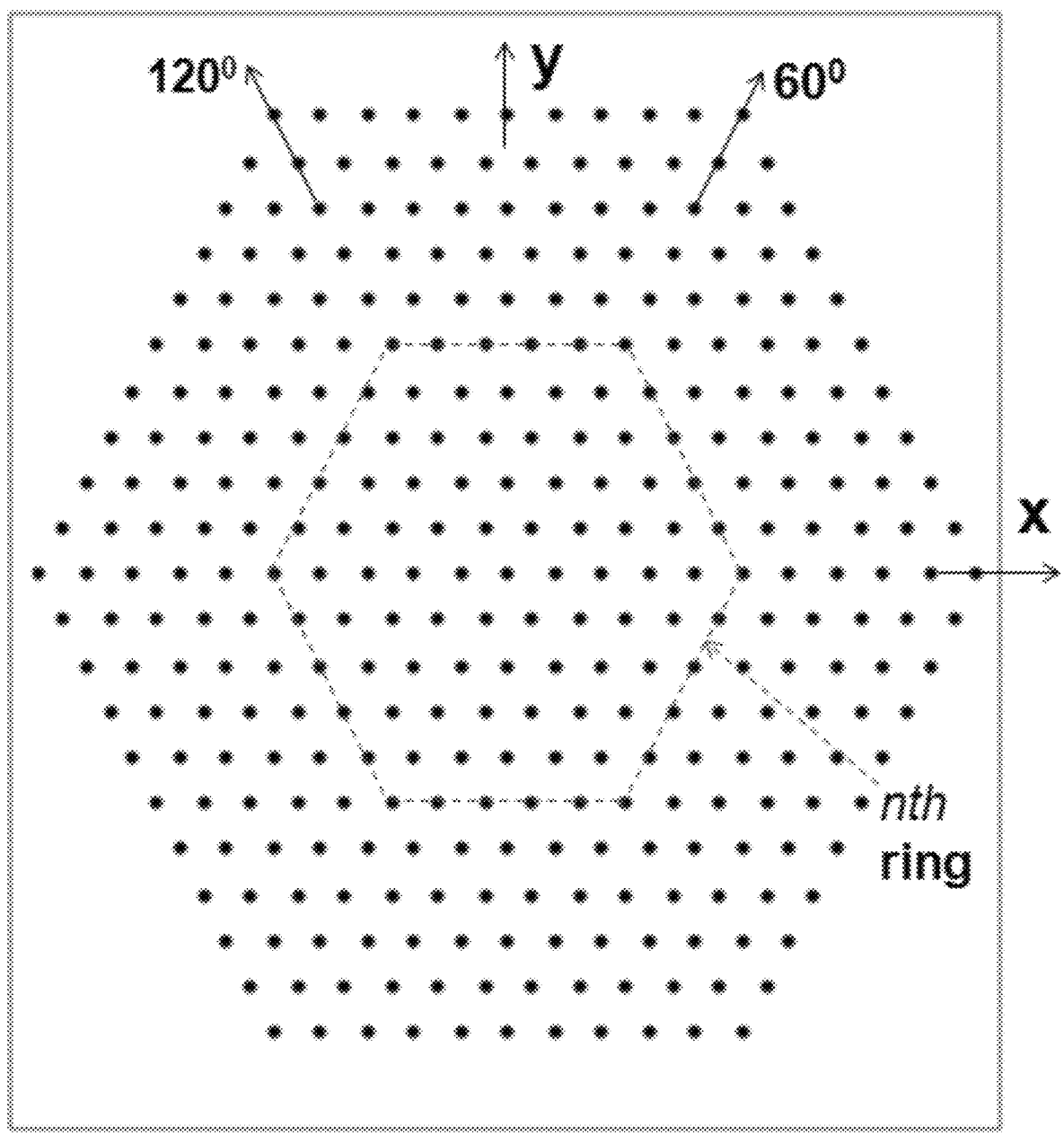
FIG. 5 illustrates multi-electron spot sizes as a wafer without presence of the Wien filter of FIG. 1 and FIG. 2.

Computer simulations were conducted to demonstrate hundreds of electron beamlet image-formations at the wafer, as shown in FIG. 5. The example in FIG. 5 is for 331 electron beamlets with a hexagon distribution, though other numbers of beamlets or distributions are possible. The multi-electron beam FOV (i.e., the $D_i$ in FIG. 1) at the wafer 107 is defined as the farthest corner beam to farthest corner beam, which may be $D_i$ from approximately 200 to 300 microns at the wafer 107 or $D_o$ from approximately 1600 to 2400 microns at the IIP in FIG. 1 if the optical demagnification from the IIP to the wafer is 8×.

Figure 6:
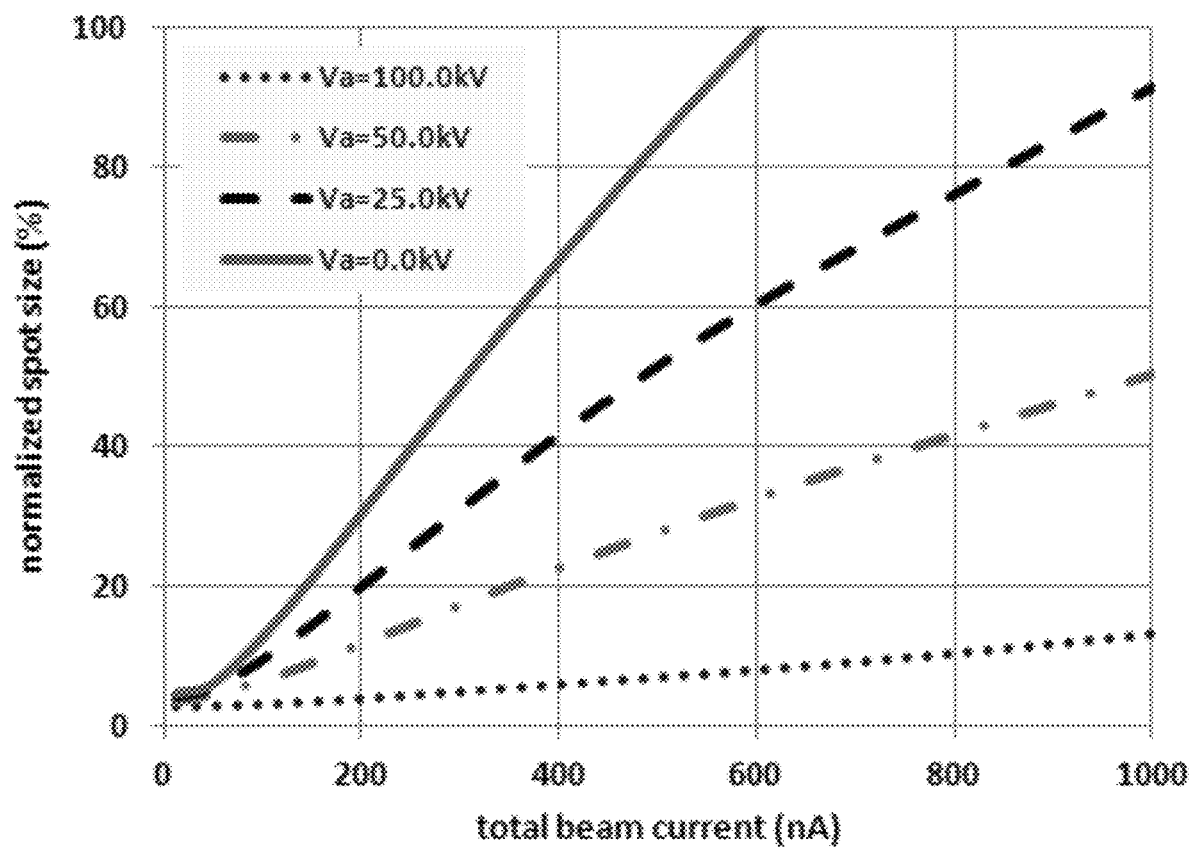
FIG. 6 is a chart showing multi-electron beam resolution improvement with acceleration voltages (Va)

Computer simulations were further conducted to demonstrate the spot size versus beam current relations, as shown in FIG. 6. The total beam current is the summation of all currents of beamlets (e.g., 331 beams in FIG. 5), and the spot size reflects the optical performance (resolution) including taking into account all optical blurs (e.g., the blurs due to lens aberrations and due to Coulomb interactions between electrons). The acceleration voltage Va is applied with 0 kV, 25 kV, 50 kV, and 100 kV in simulations, respectively. For each acceleration voltage Va, the magnetic excitation (the coil current) of the objective lens 109 is used to focus the beam on the wafer 107. The crossover (xo) is set around the acceleration electrode 119 (Va) for raising the beam energy around the crossover up to (BE+Va), where the BE is the beam energy in column before the electrons are accelerated. Based on FIG. 6, the acceleration voltage Va on the booster can help improve the multi-electron beam resolutions.

Although FIG. 5 shows the distribution of the electron beam spots at the wafer 107, it may be further used to illustrate some properties in the x-y plane of the optics in FIG. 1 and FIG. 2.

FIG. 5 shows the aperture array 103 in FIG. 1. The holes of the aperture array 103 may be hexagonal-distributed because a hexagon is close to be rotationally symmetric in optics. Other shapes are possible. The size of each hole in the aperture array 103 is used to select the electron current of a beamlet. The number of holes in the aperture array 103 is the number of beamlets.

The total MB (multi-electron beam) number ($MB_{tot}$) in FIG. 1 may be scaled by Equation (1).

$$MB_{tot} = \frac{1}{4}(1 + 3M_x^2) \quad (1)$$

In Equation (1), the $M_x$ is the number of all beamlets in the x-axis in FIG. 5. For example, within the five rings of the hexagonal distributed beamlets in FIG. 5, the number of all beamlets in x-axis is $M_x=11$, giving the number of total beamlets $MB_{tot}=91$. Within the 10 rings, the $M_x=21$, and $MB_{tot}=331$.

FIG. 5 also may show the position and size of each micro stigmator in the micro stigmator array 104, each micro deflector in the micro deflector array 105, and each micro lens in the micro lens array 106 in FIG. 1. FIG. 5 also may show the intermediate image plane in FIG. 1 and FIG. 2, in which the multi-electron beams are image-formed with an intermediate spot size array in a hexagonal distribution.

FIG. 5 also shows the sample (wafer) plane in FIG. 1 and FIG. 2, in which the multi-electron beams are image-formed with a final spot size array in a hexagonal distribution. From the intermediate image plane to wafer plane, the multi-electron beam FOV is de-magnified with 1/M. The M is an optical magnification from the IIP to the wafer. The optical magnification is $M=D_i D_o$ in FIG. 1, where the $D_i$ and $D_o$ are referred to as the FOV in the image plane and object plane of the projection optics, respectively. $D_o=2\times n=2np$, where n the number of the hexagon-ring and p is the spacing between beamlets.

With FIG. 5, the total beamlets are calculated with Equation (1) and each beamlet is addressed with the ring numbers (nth ring, n=0,1,2,3, . . . ) and polar angles. For example, the (10th ring, 60°) and (10th ring, 120°) address the farthest corner beamlets at 60° and 120°, respectively.

With desire for higher throughputs with more electron beamlets, the secondary electron beams in FIG. 1 and FIG. 2 may be separated from the optical axis and deflected toward a side detection array 111 for reducing cross-talk between secondary electron beams. The Wien filter in FIG. 1 and FIG. 2 can enable this separation. However, this can introduce energy dispersion blurs of the beamlets at the wafer 107 because all the electrons emitted from the electron source have an energy spread (e.g., approximately 1 eV with a TFE source).

Figure 7:
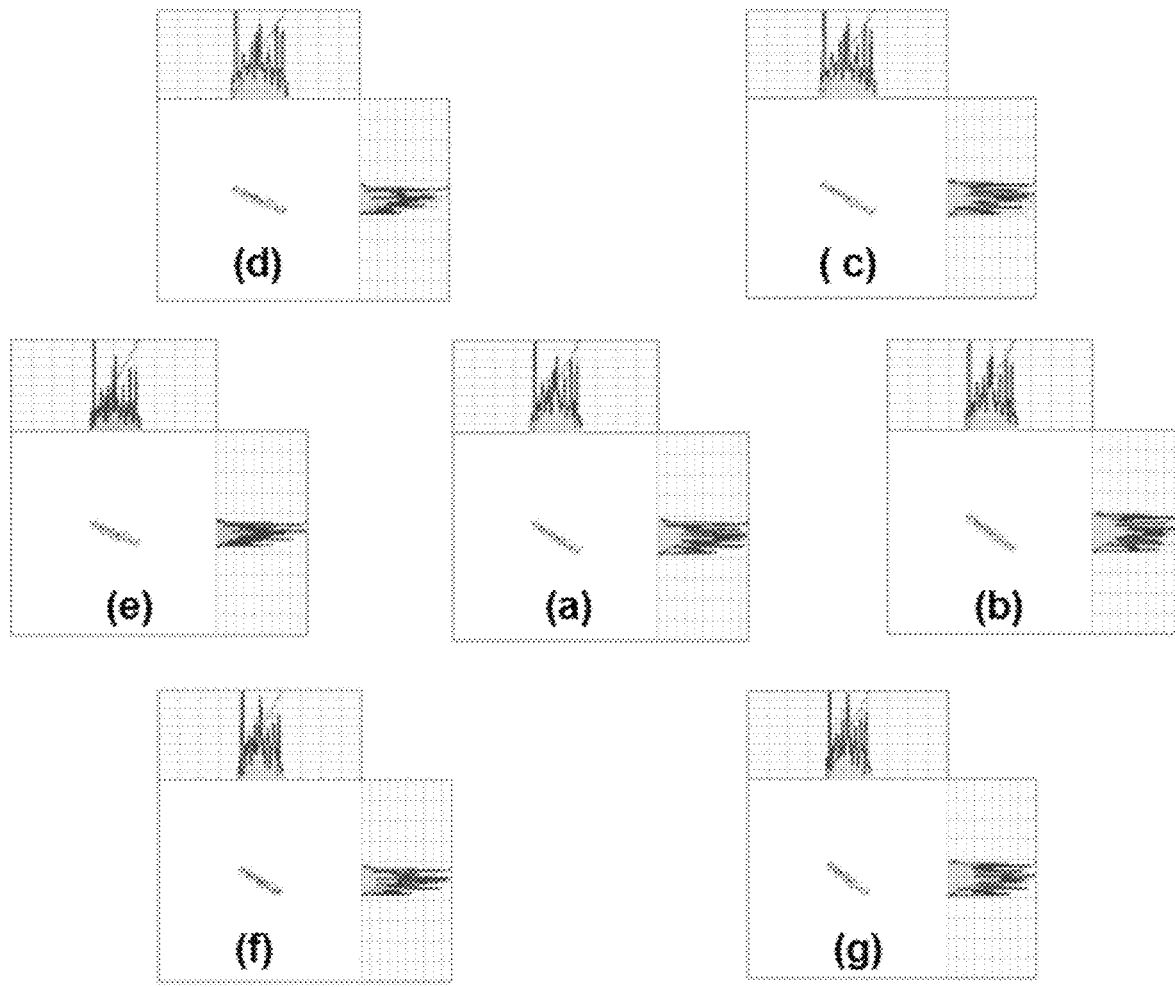
FIG. 7 shows source energy dispersion blurs due to presence of a Wien filter.

Computer simulations of the optical systems in FIG. 1 and FIG. 2 show that the electrons of beamlet spots at wafer are expanded and distributed in the same direction, as shown in FIG. 7, because the energy dispersion angles of electrons are only distributed in the direction of the Wien filter balance between the electrostatic force and magnetic force (e.g., x-axis or y-axis directions). Even with the rotations of the electrons when the electrons experience the focus of the magnetic objective lens 109, the electrons keep the same direction of energy-dispersed distributions. FIG. 7 shows seven source energy dispersed blurs of the typical beamlets at the center (0th ring) and the 10th ring with 0°, 60°, 120°, 180°, 240°, and 300°, respectively.

Figure 8:
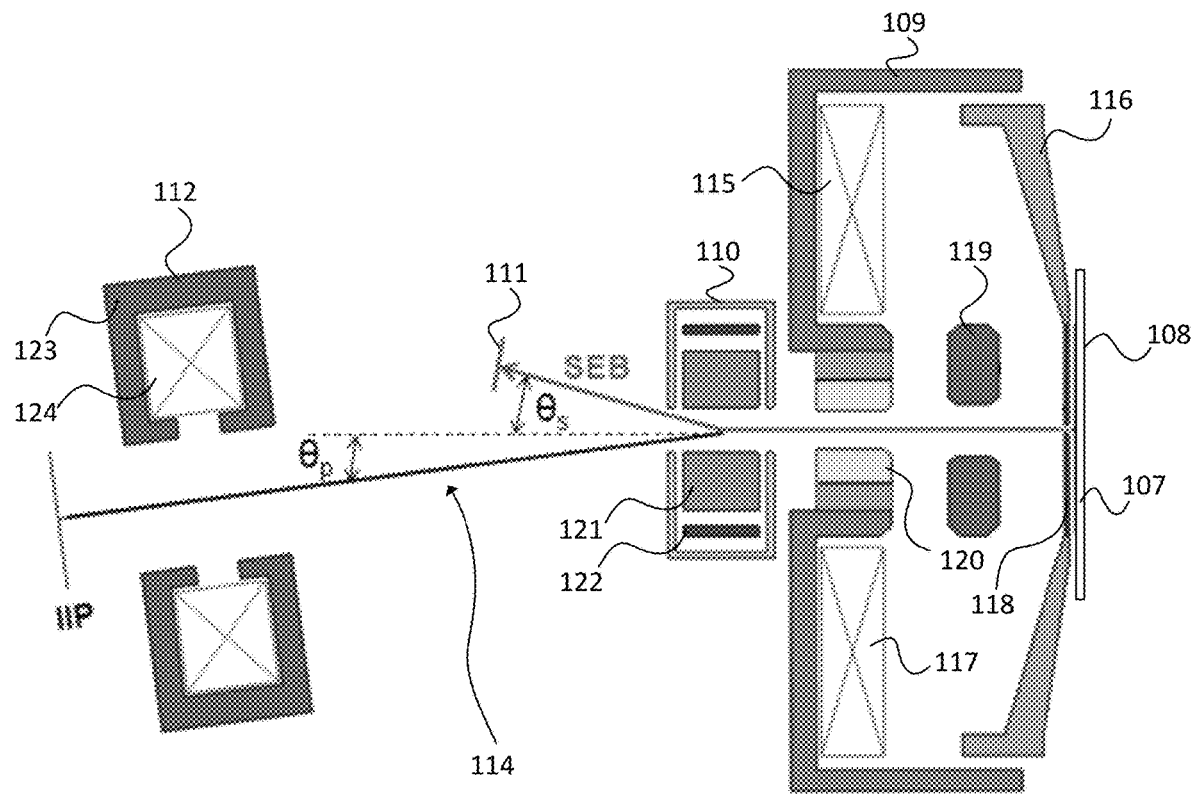
FIG. 8 is an embodiment of a global-tilt optical column that corrects source energy dispersion blurs in accordance with the present disclosure.

The source energy dispersion blurs with all the beamlets due to the presence of the Wien filter 110 can be corrected with a globally tilted optical column, as shown in FIG. 8, in which $\theta_p$ is the column tilt angle for primary multi-electron beams with respect to the center of the Wien filter 110, and $\theta_s$ is the secondary electron beam (SEB) angle toward the detection array 111. The path of the electron beam 114 is at a first orientation leaving the transfer lens 112 and at a second orientation different from the first orientation leaving the Wien filter 110 such that the first orientation is at a non-parallel angle to the second orientation. The $\theta_s$ is the angle of the secondary electron beam deflection by the Wien filter 110. All the energy dispersion blurs in FIG. 7 can be corrected if the angles $\theta_p$ and $\theta_s$ meet certain conditions. For multi-beam uses, the secondary electron angle $\theta_s$ may be approximately 10° to 45° and the primary electron beam angle $\theta_s$ can be given with the equations.

If the angles $\theta_p$ and $\theta_s$ in FIG. 8 meet the relation defined in Equation (2), the source energy dispersion blurs generated by the electrostatic and magnetic deflection fields in a Wien filter 110 may be cancelled by each other. Equations (2) and (3) can be used to balance corrections of energy dispersions.

$$\frac{\theta_P}{\theta_S} = \frac{1-\rho}{1+2\sqrt{1-\rho}} \quad (2)$$

$$\rho = \frac{LE}{V_P} = \frac{V_P - V_S}{V_P} = 1 - \frac{V_S}{V_P} (\rho = 0 \sim 1) \quad (3)$$

In Equations (2) and (3), $V_p$ and $V_s$ are the energy voltages of the primary electron beams and secondary electron beams in the Wien filter region, and the LE is the landing energy of the primary electron beams on the wafer. For example, $\rho=1/30$ if LE=1 kV and Vp=30 kV, giving $\theta_p/\theta_s=0.33$. Thus, the column tilt angle $\theta_p$ is one third of the detection array angle $\theta_s$. The SEB angle $\theta_s$ can be relatively large for a multi-electron beam system with hundreds of beamlets (e.g., $\theta_s=15°$) so the tilt column angle may be $\theta_p=5°$.

Equation (2) meets not only the cancelling condition of source energy dispersion, but also the alignment condition of the primary beam. The tilt primary beam with an angle $\theta_p$ in FIG. 8 is aligned to the objective lens 109 optical axis if the alignment condition is met. The alignment condition can require the electrostatic field of the Wien filter 110 to deflect an angle of $\theta_p$ in the y-direction and the magnetic field of the Wien filter 110 to deflect at an angle of $2\theta_p$ in the −y-direction. This assumes that the cross-section of FIG. 8 is in the y-z plane.

The Wien filter 110 electrostatic and magnetic deflection fields can be generated by the octupoles in FIG. 3 and FIG. 4, respectively. Due to the fact that the deflection fields are fairly uniform in a large central region (i.e., equipotential lines in FIG. 4), the energy dispersion cancellations can be fairly uniform in a large region such that the energy dispersion blurs of hundreds of beamlets in FIG. 7 may be cancelled by a global Wien filter simultaneously.

If the primary beam landing energy (LE) is changed in a range, the secondary electron beam may be over-deflected or under-deflected compared to a given (i.e., fixed) detection array 111 angle $\theta_s$. However, such a misaligned secondary electron beam may be corrected with aligners (i.e., deflectors) in the secondary electron-collection optics (not shown).

Figure 9:
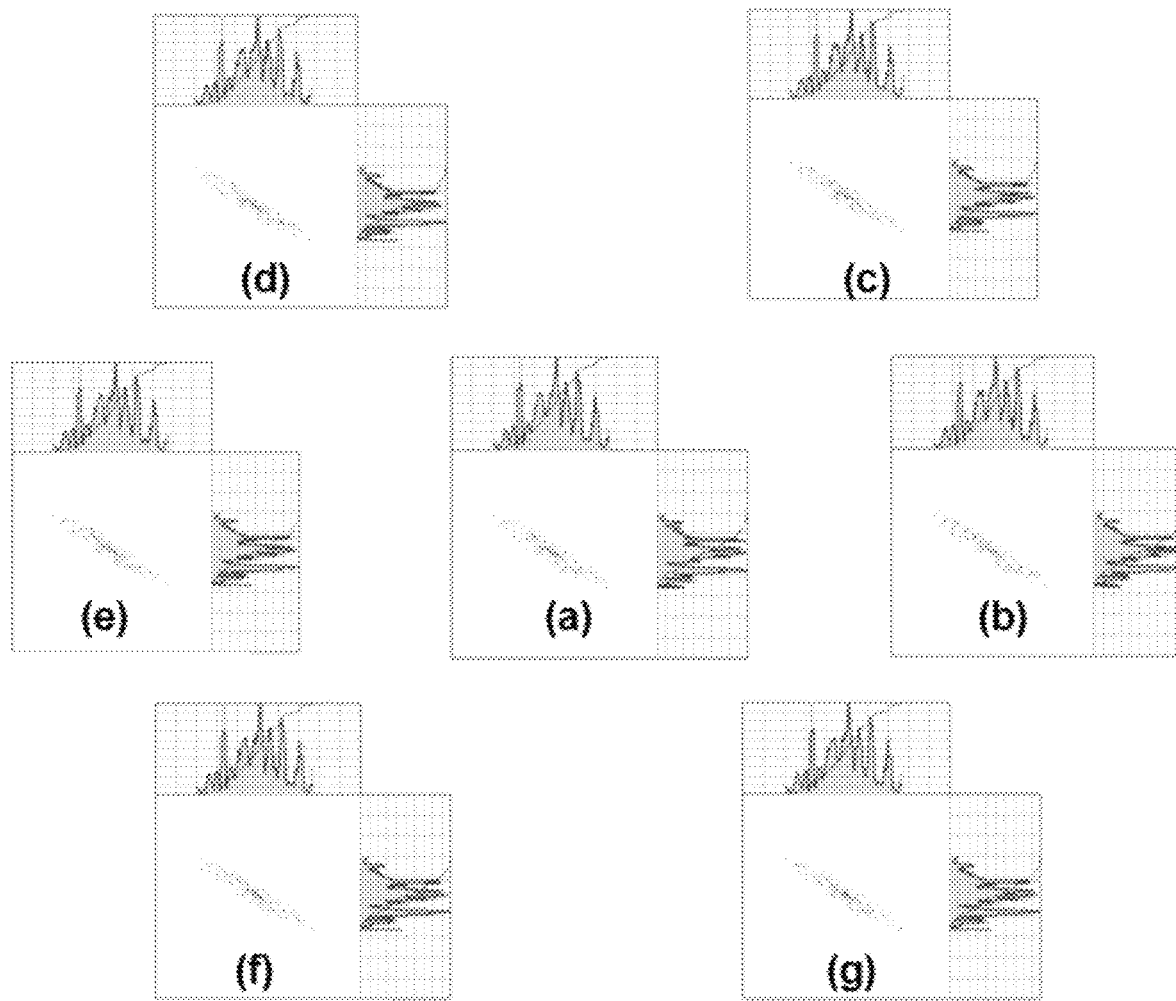
FIG. 9 shows astigmatism blurs due to presence of a Wien filter.

The presence of the Wien filter 110 in FIG. 8 introduces the astigmatism blurs of the beamlets at the wafer 107. Computer simulations on the optical systems in FIG. 8 show that the electrons of the astigmatism spots (the ellipse spots)

at the wafer 107 are distributed in the same direction, as shown in FIG. 9. Even with the rotations of the electrons when they experience the focus of the magnetic objective lens 109, the electrons still keep the same direction at the wafer 107 as they are experiencing the Wien filter 110. FIG. 9 shows seven astigmatism blurs of the typical beamlets at the center (0th ring) and the 10th ring with 0°, 60°, 120°, 180°, 240°, and 300°, respectively.

Figure 10:
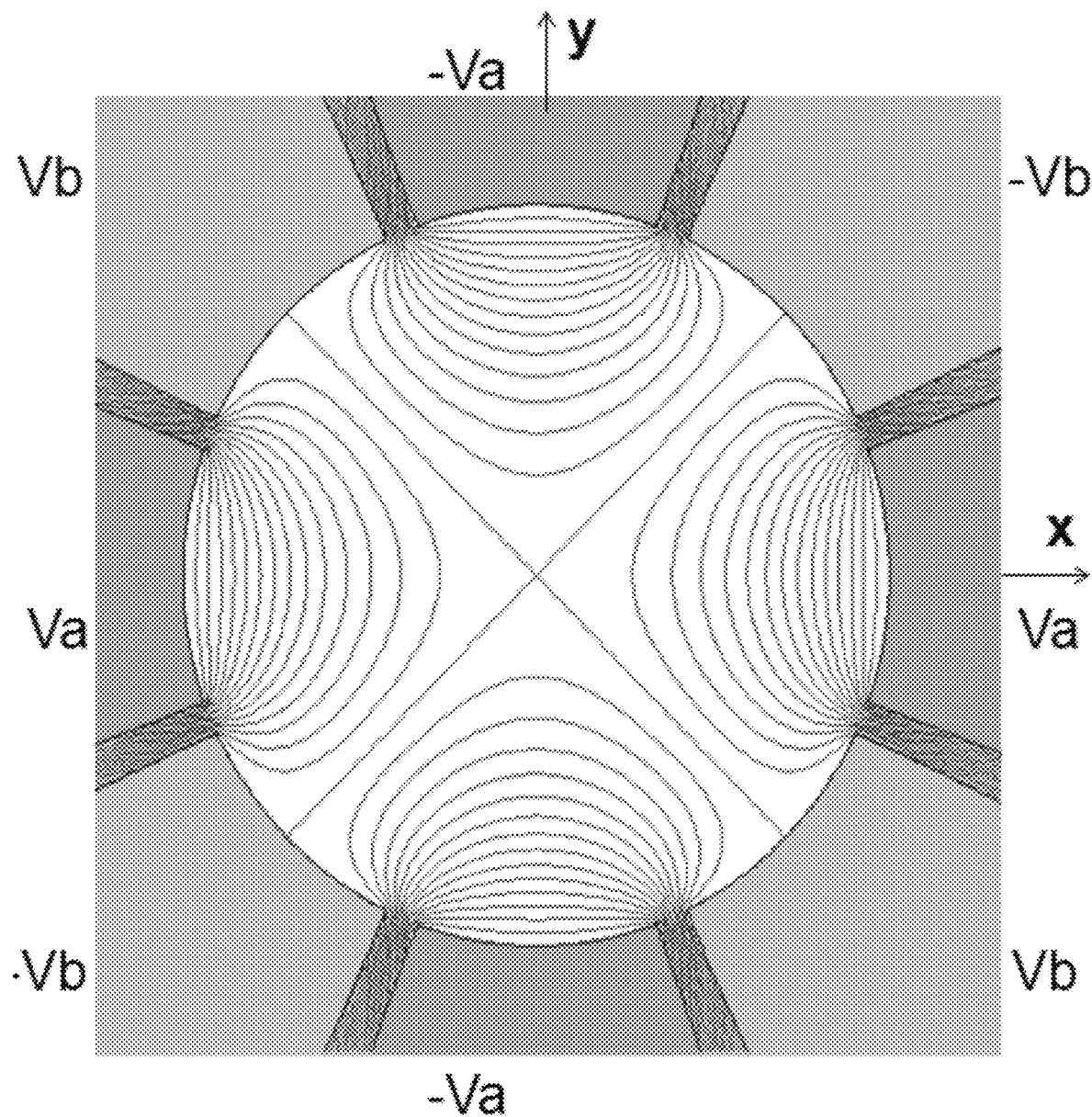
FIG. 10 illustrates a global electrostatic stigmator that includes the octupole deflection plates in a Wien filter.

The astigmatism blurs with all the beamlets due to the presence of the Wien filter 110 can be corrected with a global stigmator, as shown in FIG. 10. The eight plates of the octupole (electrostatic) deflector in FIG. 10 may be used as two stigmators applying two groups of voltages ±Va and ±Vb. For example, the equipotential lines in FIG. 10 are given through computer simulations with applying the voltages of Va=1 unit and Vb=0 units. This example generates the electrostatic field distributions that focus the electron beam in y-axis direction and defocus the electron beam in x-axis direction. Changing Va and Vb may vary the combined electrostatic force around the polar angle from zero degrees to 360 degrees, such that the astigmatism blurs in any direction may be corrected by selecting the Va and Vb voltages.

Figure 11:
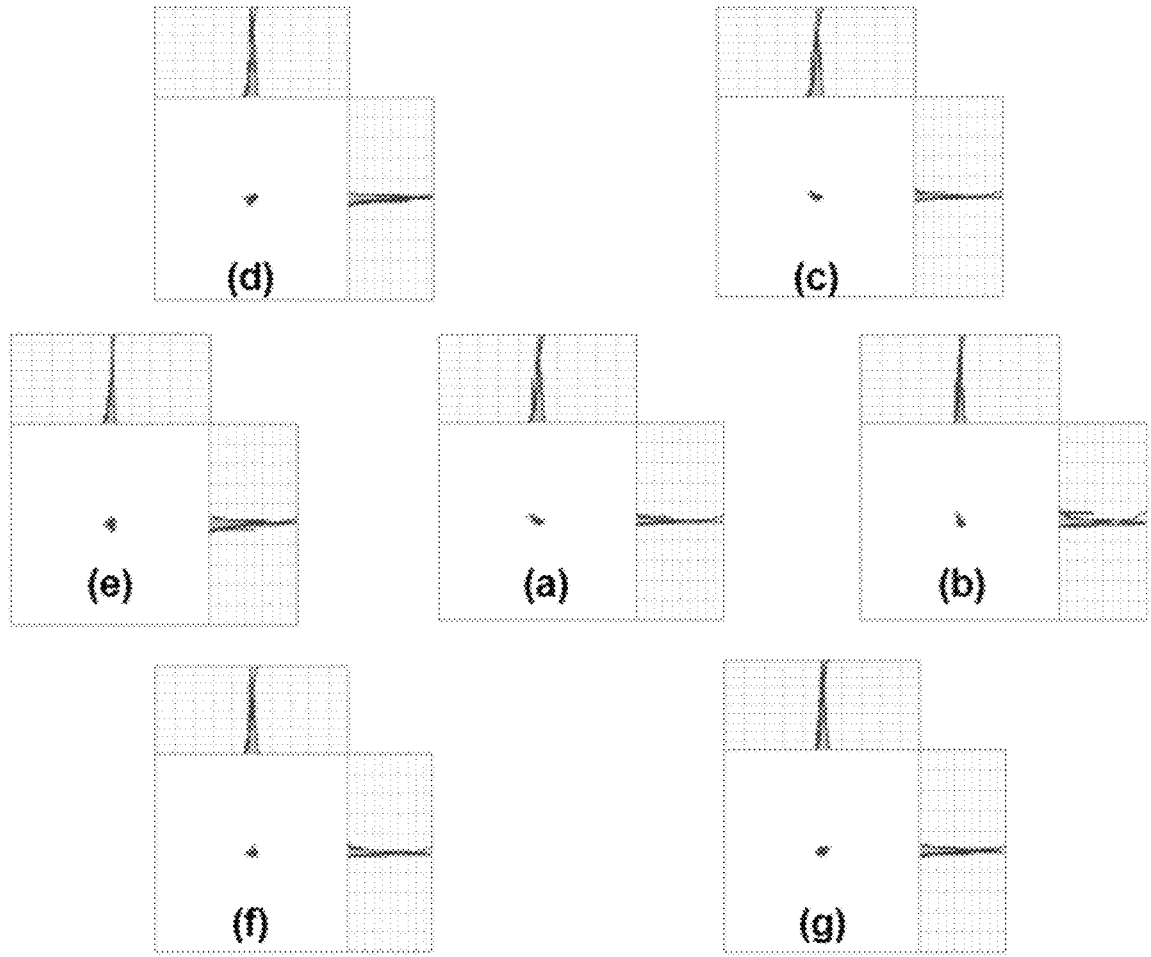
FIG. 11 shows image uniformity across a large field-of-view with 331 beamlets after the energy dispersion and astigmatism are corrected.

After conducting the corrections of the source energy dispersion and astigmatism with the global tilt column of FIG. 8 and a global stigmator of FIG. 10, the final spot sizes across a large field-of-view for 331 beamlets can meet desired resolutions and image-forming uniformities, as shown in FIG. 11. Computer simulations further show that the spot size versus beam current relation may be again characterized by the plots in FIG. 6, meaning that the source energy dispersion and astigmatism are all removed without influencing the final resolutions. Similar to FIGS. 7 and 9, (a), (b), (c), (d), (e), (f), and (g) in FIG. 11 are the final spots of the beamlets at center (0th ring) and the 10th ring with 0°, 60°, 120°, 180°, 240°, and 300°, respectively.

Figure 12:
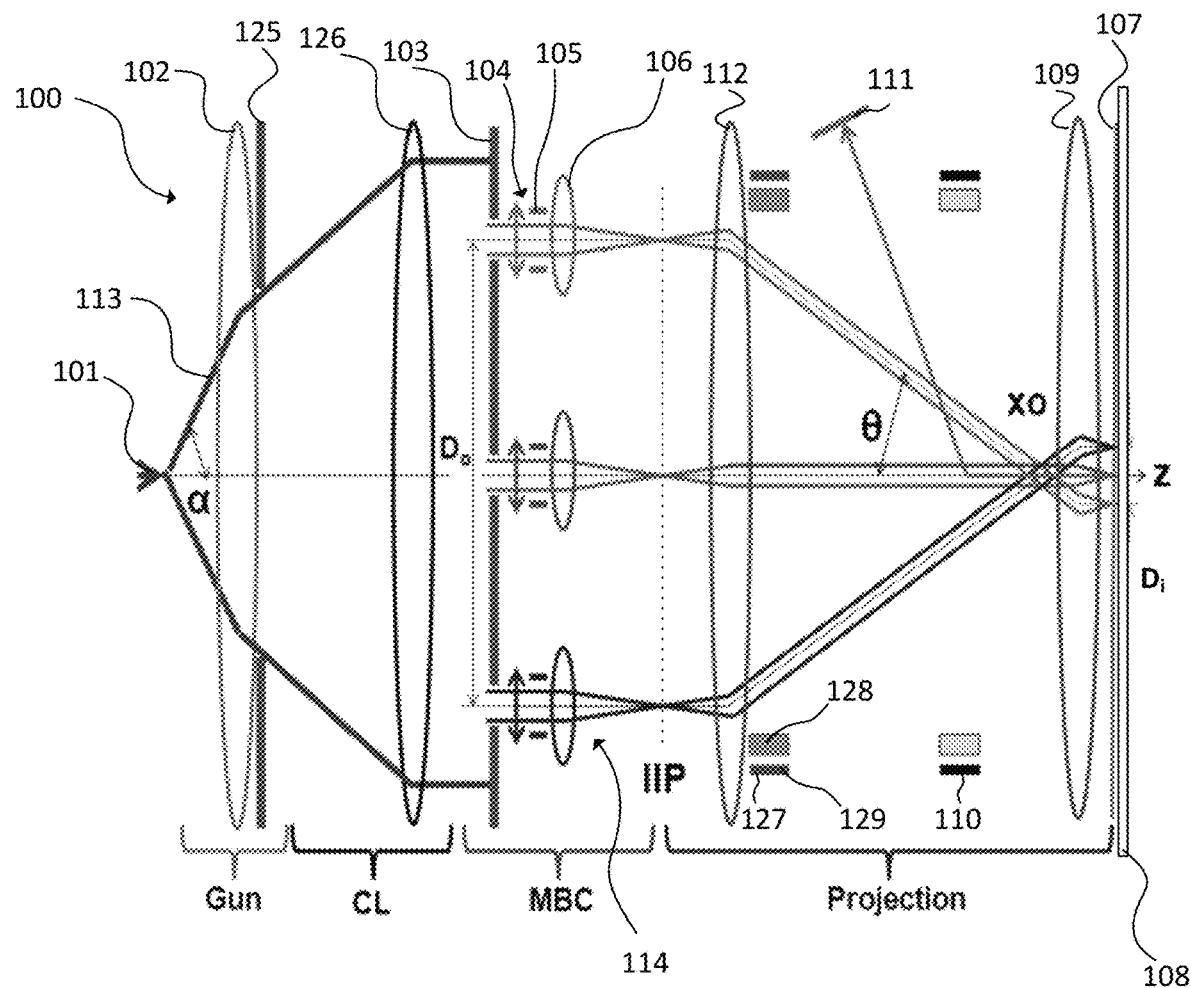
FIG. 12 is another embodiment of a system in accordance with the present disclosure.

As shown in FIG. 12, a second Wien filter 127 can be added along the path of the beamlets between the Wien filter 110 and the transfer lens 112. The second Wien filter includes a second electrostatic deflector 128 and a second magnetic deflector 129.

The source energy dispersion blurs due to the presence of a Wien filter in FIG. 7 may be corrected using two Wien filters. In FIG. 12, the lower Wien filter 110 closer to the wafer 107 can be used to deflect the secondary electron beam toward the side detection array 111. The second (or upper) Wien filter 127 closer to the transfer lens 112 can be used to compensate the energy dispersion. The energy dispersion generated in the Wien filter 127 can be used to compensate the energy dispersion generated in the Wien filter 110. Use of two Wien filters is further described in U.S. Pat. No. 10,090,131, which is incorporated by reference in its entirety.

With an accelerating magnetic objective lens scheme in FIG. 2 and FIG. 8, the resolutions of multi-electron beamlets are improved by increasing the accelerating voltage Va. The accelerating voltage Va may be increased to a level without arcing and such that the electron beamlets are stably focused on wafer with magnetic excitations.

Using two Wien filters for correcting the source energy dispersion blurs in FIG. 7, the primary beam optical column is a straight column, but can provide a similar performance of corrections as the tilt column in FIG. 8 does.

Figure 13:
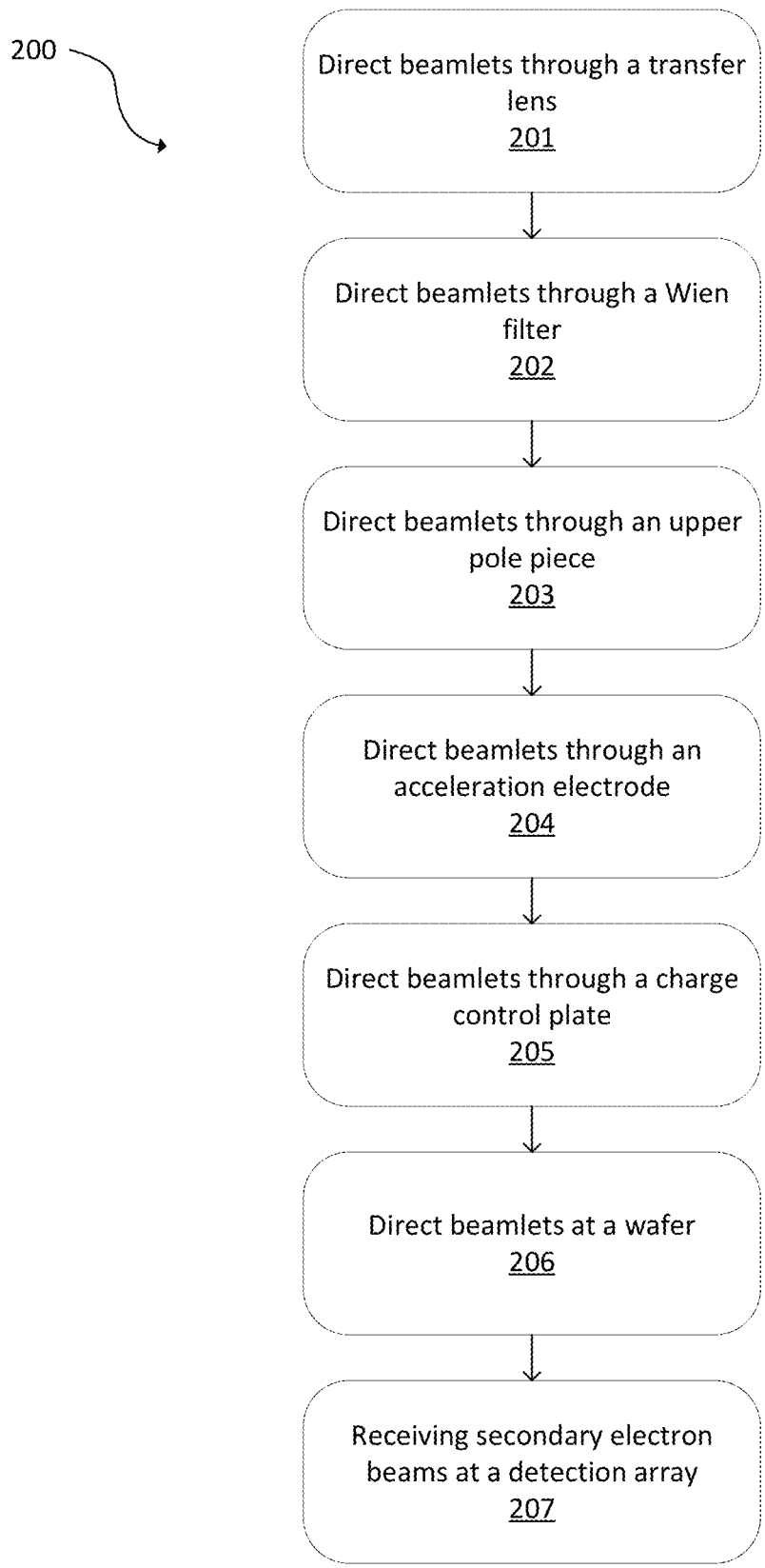
FIG. 13 is a flowchart of an embodiment of a method in accordance with the present disclosure.

FIG. 13 is a flowchart of method 200. At 201, a plurality of beamlets are directed through a transfer lens downstream of an electron beam source thereby focusing the electron beam. For example, there may be at least 100 of the beamlets (e.g., greater than 300 beamlets). At 202, the beamlets are directed through a Wien filter downstream of the transfer lens thereby separating the secondary electron beams from the beamlets. The Wien filter can have an electrostatic deflector and a magnetic deflector. At 203, the beamlets are directed through an upper pole piece of an objective lens. The objective lens is downstream of the Wien filter. The Wien filter can be configured to adjust dispersion and astigmatism for the beamlets simultaneously. At 204, the beamlets are directed through an acceleration electrode downstream of the upper pole piece. The acceleration electrode can be configured to change the resolution of the beamlets. At 205, the beamlets are directed through a charge control plate disposed in a lower pole piece of the objective lens. The charge control plate is disposed on an opposite side of the objective lens from the upper pole piece. The beamlets are directed at a wafer at 206. Secondary electron beam or beams from the wafer are received at a detection array at 207.

The method 200 can further include generating an electron beam using the electron beam source and converting the electron beam into the plurality of beamlets. The electron beam can be directed through a collimation lens and a beam limiting aperture disposed in a path of the electron beam between the electron beam source and the transfer lens.

The method 200 can further include scanning the beamlets with a scanner (i.e., a deflector) disposed on the upper pole piece.

The method 200 can further include splitting an electron beam into the beamlets using an aperture array. The aperture array is disposed in a path of the electron beam between the electron beam source and the transfer lens. The beamlets are directed through a micro stigmator array disposed in the path of the beamlets between the aperture array and the transfer lens; a micro deflector array disposed in the path of the beamlets between the micro stigmator array and the transfer lens; and a micro lens array disposed in the path of the beamlets between the micro deflector array and the transfer lens. The electron beam can be a telecentric beam upstream of the aperture array.

The method 200 can further include changing a direction of the beamlets using the Wien filter such that the beamlets are directed at an angle leaving the Wien filter relative to their orientation entering the Wien filter.

The method 200 can include directing the beamlets through a second Wien filter in a path of the beamlets between the Wien filter and the transfer lens.

The method 200 can be used when conditions of the system change. For example, the method 200 can be used while changing beam energy, landing energy, beam current, FOV, or other parameters.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
    an electron beam source that generates an electron beam, wherein the electron beam source includes a tip, a suppression electrode, and an extraction electrode;
    a stage configured to hold a wafer in a path of the electron beam;
    an objective lens in the path of the electron beam, wherein the objective lens includes:

an upper pole piece;
a lower pole piece;
an objective lens coil disposed on the upper pole piece;
a charge control plate disposed on the lower pole piece;
an acceleration electrode disposed in the path of the electron beam between the upper pole piece and the lower pole piece; and
a scanner disposed on the upper pole piece;
a Wien filter in the path of the electron beam between the objective lens and the electron beam source;
a transfer lens in the path of the electron beam between the Wien filter and the electron beam source, wherein the transfer lens includes a pole piece and a transfer lens coil; and
a detection array configured to receive at least one secondary electron beam from the wafer on the stage.

2. The system of claim 1, wherein the Wien filter includes an electrostatic deflector and a magnetic deflector.

3. The system of claim 1, further comprising:
a collimation lens in the path of the electron beam; and
a beam limiting aperture in the path of the electron beam between the collimation lens and the electron beam source.

4. The system of claim 1, further comprising:
an aperture array disposed in the path of the electron beam, wherein the aperture array splits the electron beam into a plurality of beamlets;
a micro stigmator array disposed in the path of the electron beam between the aperture array and the transfer lens;
a micro deflector array disposed in the path of the electron beam between the micro stigmator array and the transfer lens; and
a micro lens array disposed in the path of the electron beam between the micro deflector array and the transfer lens.

5. The system of claim 4, wherein the plurality of beamlets includes at least 100 of the beamlets.

6. The system of claim 4, wherein the electron beam is a telecentric beam upstream of the aperture array.

7. The system of claim 1, wherein the path of the electron beam is at a first orientation leaving the transfer lens and at a second orientation different from the first orientation leaving the Wien filter such that the first orientation is at a non-parallel angle to the second orientation.

8. The system of claim 1, further comprising a second Wien filter in the path of the electron beam between the Wien filter and the transfer lens.

9. The system of claim 8, wherein the second Wien filter includes a second electrostatic deflector and a second magnetic deflector.

10. A method comprising:
directing a plurality of beamlets through a transfer lens downstream of an electron beam source thereby focusing the electron beam;
directing the beamlets through a Wien filter downstream of the transfer lens thereby separating at least one secondary electron beam from the beamlets;
directing the beamlets through an upper pole piece of an objective lens, wherein the objective lens is downstream of the Wien filter;
directing the beamlets through an acceleration electrode downstream of the upper pole piece;
directing the beamlets through a charge control plate disposed in a lower pole piece of the objective lens, wherein the charge control plate is disposed on an opposite side of the objective lens from the upper pole piece;
directing the beamlets at a wafer; and
receiving the at least one secondary electron beam from the wafer at a detection array.

11. The method of claim 10, wherein the plurality of beamlets includes at least 100 of the beamlets.

12. The method of claim 10, further comprising:
generating an electron beam using the electron beam source; and
converting the electron beam into the plurality of beamlets.

13. The method of claim 11, further comprising:
directing the electron beam through a collimation lens and a beam limiting aperture disposed in a path of the electron beam between the electron beam source and the transfer lens.

14. The method of claim 10, further comprising scanning the beamlets with a scanner disposed on the upper pole piece.

15. The method of claim 10, wherein the Wien filter includes an electrostatic deflector and a magnetic deflector.

16. The method of claim 10, further comprising:
splitting an electron beam into the beamlets using an aperture array, wherein the aperture array is disposed in a path of the electron beam between the electron beam source and the transfer lens;
directing the beamlets through a micro stigmator array disposed in the path of the beamlets between the aperture array and the transfer lens;
directing the beamlets through a micro deflector array disposed in the path of the beamlets between the micro stigmator array and the transfer lens; and
directing the beamlets through a micro lens array disposed in the path of the beamlets between the micro deflector array and the transfer lens.

17. The method of claim 16, wherein the plurality of beamlets includes at least 100 of the beamlets.

18. The method of claim 16, wherein the electron beam is a telecentric beam upstream of the aperture array.

19. The method of claim 10, further comprising changing a direction of the beamlets using the Wien filter such that the beamlets are directed at an angle leaving the Wien filter relative to their orientation entering the Wien filter.

20. The method of claim 10, further comprising directing the beamlets through a second Wien filter in a path of the beamlets between the Wien filter and the transfer lens.

21. The method of claim 10, wherein the acceleration electrode is configured to change the resolution of the beamlets.

22. The method of claim 10, wherein the Wien filter is configured to adjust dispersion and astigmatism for the beamlets simultaneously.

* * * * *